United States Patent
Liao et al.

(10) Patent No.: US 12,165,952 B2
(45) Date of Patent: Dec. 10, 2024

(54) INTERPOSER DIRECTLY BONDED TO BONDING PADS ON A PLURALITY OF DIES

(71) Applicant: Taiwan Semiconductor Manufacturing Company, Ltd., Hsinchu (TW)

(72) Inventors: Wen-Shiang Liao, Miaoli County (TW); Chieh-Yen Chen, Taipei (TW); Chuei-Tang Wang, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 375 days.

(21) Appl. No.: 17/672,722

(22) Filed: Feb. 16, 2022

(65) Prior Publication Data
US 2023/0260872 A1    Aug. 17, 2023

(51) Int. Cl.
*H01L 23/433* (2006.01)
*H01L 21/48* (2006.01)
*H01L 23/00* (2006.01)
*H01L 23/498* (2006.01)
*H01L 25/065* (2023.01)

(52) U.S. Cl.
CPC ...... *H01L 23/4334* (2013.01); *H01L 21/4857* (2013.01); *H01L 21/486* (2013.01); *H01L 23/49822* (2013.01); *H01L 23/49833* (2013.01); *H01L 23/49838* (2013.01); *H01L 24/08* (2013.01); *H01L 24/32* (2013.01); *H01L 24/73* (2013.01); *H01L 24/83* (2013.01); *H01L 25/0655* (2013.01); *H01L 2224/08237* (2013.01); *H01L 2224/32155* (2013.01); *H01L 2224/80203* (2013.01); *H01L 2224/83896* (2013.01)

(58) Field of Classification Search
CPC ........... H01L 23/4334; H01L 23/49822; H01L 23/49833; H01L 2224/08237; H01L 2224/80203; H01L 21/4857; H01L 21/486; H01L 2924/181; H01L 25/0655; H01L 24/08; H01L 24/09; H01L 24/32; H01L 24/33; H01L 24/73; H01L 24/83
See application file for complete search history.

(56) References Cited

U.S. PATENT DOCUMENTS

| | | |
|---|---|---|
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |

(Continued)

*Primary Examiner* — Alonzo Chambliss
(74) *Attorney, Agent, or Firm* — JCIPRNET

(57) ABSTRACT

A semiconductor package includes a semiconductor substrate, a plurality of first dies, a plurality of thermal conductive patterns and an interposer. The first dies are bonded to the semiconductor substrate. The thermal conductive patterns are bonded to the semiconductor substrate. The interposer is bonded to the first dies, and the first dies and the thermal conductive patterns are disposed between the semiconductor substrate and the interposer.

20 Claims, 11 Drawing Sheets

(56) References Cited

U.S. PATENT DOCUMENTS

| | | | |
|---|---|---|---|
| 11,749,625 B2* | 9/2023 | Kuo | H01L 23/3128 |
| | | | 257/428 |
| 11,791,301 B2* | 10/2023 | Jeng | H01L 25/105 |
| | | | 257/737 |
| 2015/0235991 A1* | 8/2015 | Gu | H01L 25/105 |
| | | | 174/262 |
| 2016/0315071 A1* | 10/2016 | Zhai | H01L 24/73 |
| 2018/0033770 A1* | 2/2018 | Hsu | H01L 25/50 |

* cited by examiner

INTERPOSER DIRECTLY BONDED TO BONDING PADS ON A PLURALITY OF DIES

BACKGROUND

The integrated circuit (IC) industry has experienced a fast-paced growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
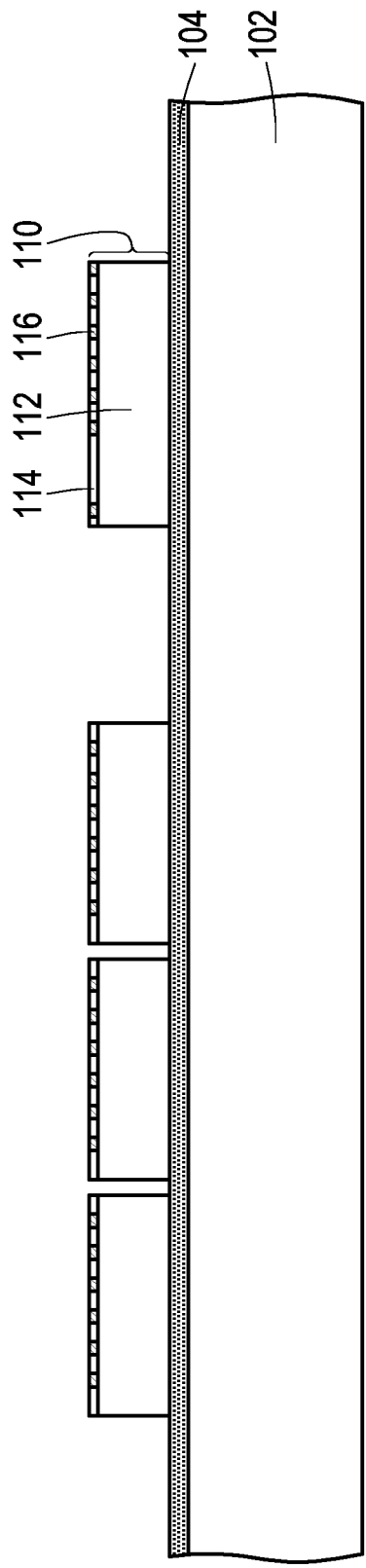
FIG. 1A to FIG. 1H illustrate schematic cross-sectional views of a method of forming a semiconductor package in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1H illustrate schematic cross-sectional views of a method of forming a semiconductor package in accordance with some embodiments of the disclosure. FIG. 2 is a schematic top view showing the thermal conductive patterns and the dies of a semiconductor package in accordance with some embodiments of the disclosure. It is understood that the disclosure is not limited by the method described below. Additional operations can be provided before, during, and/or after the method and some of the operations described below can be replaced or eliminated, for additional embodiments of the methods.

Although FIG. 1A to FIG. 1H are described in relation to a method, it is appreciated that the structures disclosed in FIG. 1A to FIG. 1H are not limited to such a method, but instead may stand alone as structures independent of the method.

Figure 2:
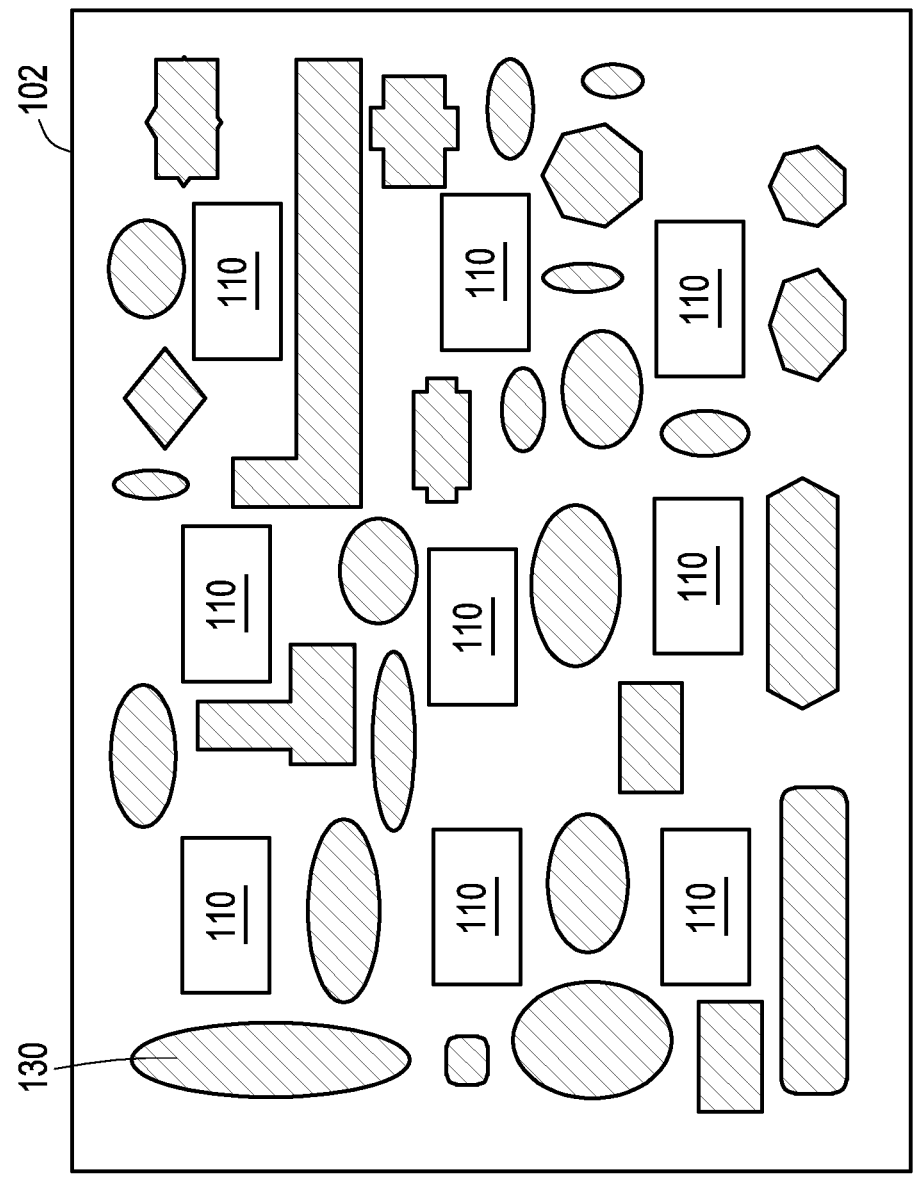
FIG. 2 is a schematic top view showing the thermal conductive patterns and the dies of a semiconductor package in accordance with some embodiments of the disclosure.

Referring to FIG. 1A, a plurality of dies 110 are provided on a carrier 102. In some embodiments, the carrier 102 is a supporting carrier. For example, the carrier 102 is a glass, a semiconductor wafer or a semiconductor block. In some embodiments, the carrier 102 includes thermal conductivity substantially equal to or larger than K value (i.e., 149 W/mK) of silicon. Thus, the carrier 102 may be also referred to as a heat sink, a heat dissipation substrate or a heat dissipation carrier. For example, the carrier 102 is made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations thereof, and the like, may also be used. In some embodiments, the carrier 102 is un-doped and/or free of active devices. The carrier 102 has a thickness in a range of 50 μm to 5000 μm, for example. However, the disclosure is not limited thereto.

In some embodiments, an adhesive layer 104 is formed on the carrier 102, and then the dies 110 are picked and placed on the adhesive layer 104 over the carrier 102 through the adhesive layer 104. The adhesive layer 104 may be a thermally conductive adhesive such as a die attach film (DAF) having high thermal conductivity, a polymer-based layer, a graphite film and a solder layer. In some embodiments, the adhesive layer 104 is a DAF. The adhesive layer 104 is formed on an entire surface of the carrier 102, for example. In other words, the adhesive layer 104 is continuously extended between the carrier 102 and the dies 110. In such embodiments, a sidewall of the adhesive layer 104 is substantially flush with a sidewall of the carrier 102. However, the disclosure is not limited thereto. In alternative embodiments (not shown), the dies 110 have adhesive layers therebeneath, respectively. In such embodiments, a sidewall of the adhesive layer is substantially flush with a sidewall of the die 110.

In some embodiments, the die 110 is an artificial intelligence (AI) core, an AI engine, a memory die, or a logic die. For example, the die 110 is a central processing unit (CPU) die, a graphic processing unit (GPU) die, a micro control unit (MCU) die, a Transceiver (TRX) die, an input-output (I/O) die, a baseband (BB) die, an application processor (AP) die, a SRAM die, a DRAM die, a flash die or a high bandwidth memory (HBM) die. In some embodiments, the die 110 is a chiplet or a die stack. The die 110 may include a semiconductor substrate 112, a bonding layer 114 on the semiconductor substrate 112 and a plurality of bonding pads 116 in the bonding layer 114. The semiconductor substrate 112 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations thereof, and the like, may also be used. In some embodiments, the bonding layer 114 includes organic materials such as polybenzoxazole (PBO) and polyimide (PI) or inorganic materials. The bonding pads 116 may be vias, pads, pillars or other suitable connectors. A material of the bonding pads 116 includes copper (Cu), aluminum (Al), aluminum copper alloy (AlCu), gold, titanium, cobalt, an alloy, or other suitable conductive material, for example. The bonding pads 116 may be formed in the back end of line (BEOL) process. In some embodiments, the dies 110 are arranged side by side. For example, the dies 110 are arranged in a matrix.

Figure 1B:
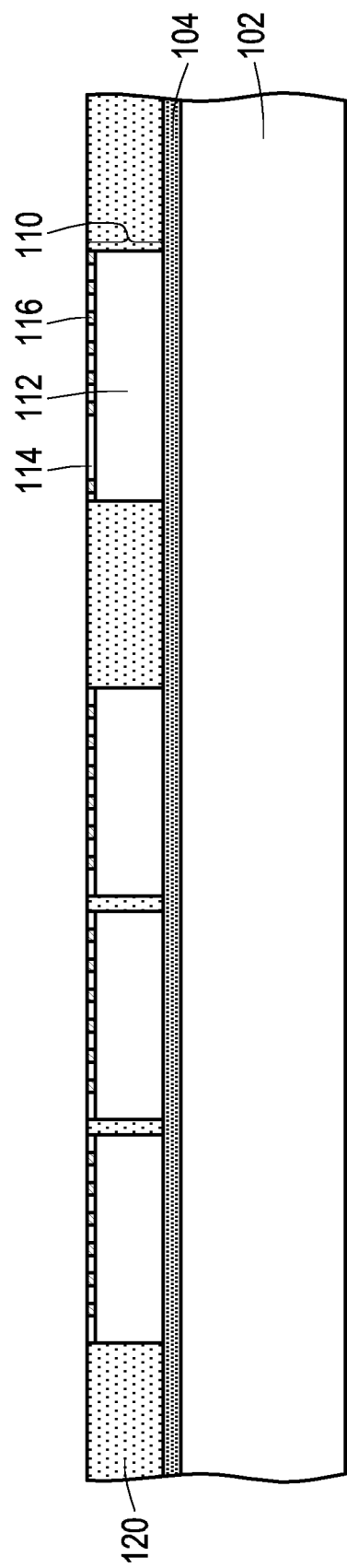

Referring to FIG. 1B, an encapsulant 120 is formed over the carrier 102 to encapsulate the dies 110. In some embodiments, the encapsulant 120 is formed by forming an insulating material to cover the dies 110 and fill up gaps between the dies 110, and then performing a planarization process on the insulating material until the dies 110 and the insulating material are accessibly revealed. The insulating material may include a dielectric material such as silicon oxide, TEOS silicon oxide, or other suitable gap-filling materials formed by a deposition process such as CVD, PECVD, or other suitable method. Formation of the insulating material may further include a gap-filling process, a curing process and/or a hardening process. The planarization process may include a grinding process, a chemical mechanical polishing (CMP) process, or other suitable removing process. In some embodiments, during the planarization process, the bonding layers 116 and the bonding pads 118 of the dies 110 are slightly removed and planarized. In other words, the bonding layers 116 and the bonding pads 118 may have planarized surfaces. In some embodiments, after forming the encapsulant 120, a surface (e.g., top surface) of the encapsulant 120 is substantially coplanar with surfaces (e.g., top surfaces) of the dies 110.

Figure 1C:
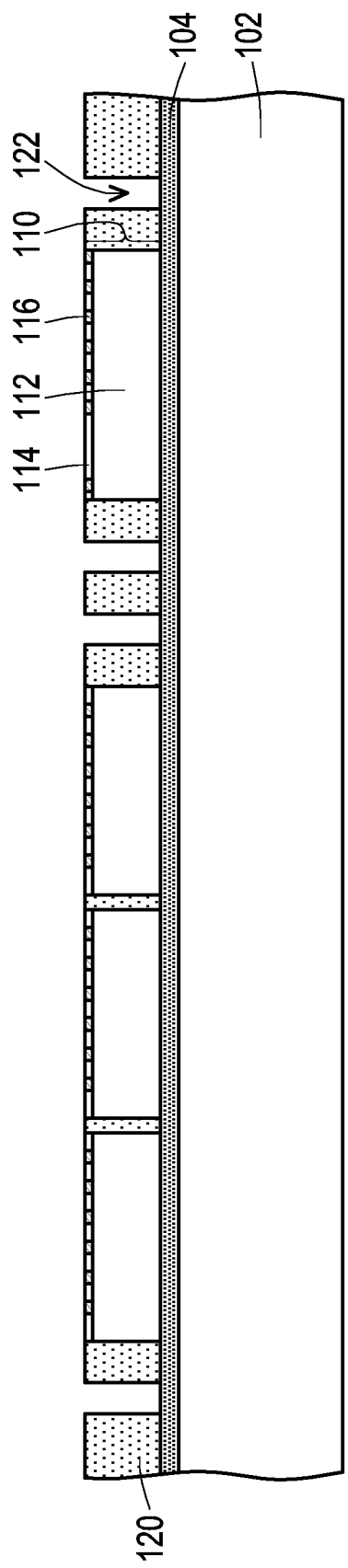

Referring to FIG. 1C, a plurality of openings 122 are formed in the encapsulant 120. In some embodiments, the openings 122 are formed aside the dies 110. For example, the openings 122 are formed between the dies 110. In some embodiments, the openings 122 are formed by a photolithography process including forming a photoresist over the encapsulant 120, etching the encapsulant 120 by an etch process such as a reactive ion etching (RIE) process and removing the photoresist.

Figure 1D:
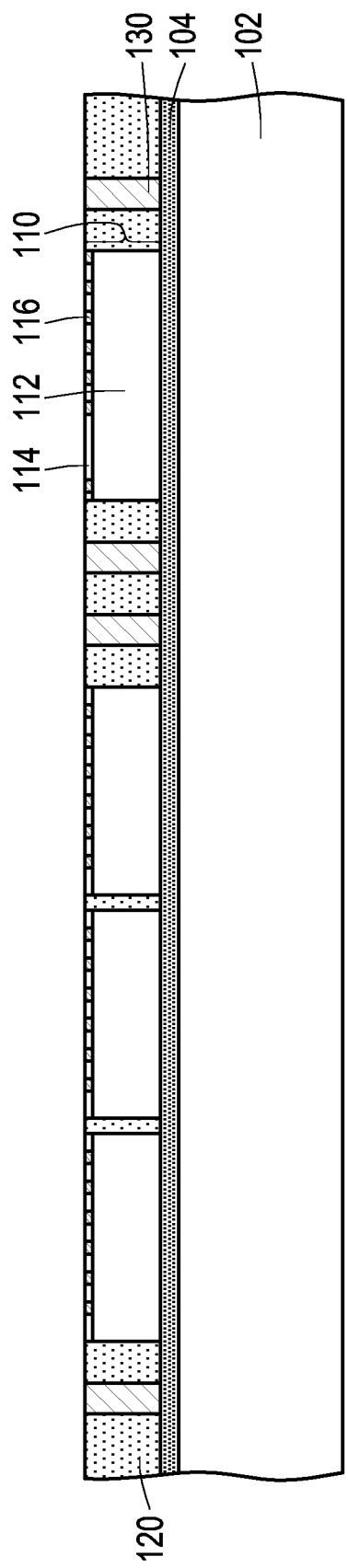

Referring to FIG. 1D, a plurality of thermal conductive patterns 130 are formed in the openings 122 of the encapsulant 120. In some embodiments, the thermal conductive patterns 130 are formed by forming a conductive material in the openings 122 and removing the conductive material outside the openings 122. Formation of the conductive material may include forming a seed layer on the sidewalls of the openings 122 and depositing a metal layer on the seed layer to fill up the openings 122. In some embodiments, the seed layer includes titanium (Ti)/copper (Cu), and the metal layer includes copper (Cu), aluminum (Al), aluminum copper alloy (AlCu), gold, titanium, cobalt, an alloy, or other suitable conductive material. The metal layer may be formed by, for example, electrochemical plating (ECP), electroplating, electroless plating or any other suitable process. The thermal conductive patterns 130 may include metal vias and/or metal lines. In some embodiments, a barrier layer may be disposed between each thermal conductive pattern 130 and the encapsulant 120 to prevent the material of the thermal conductive pattern 130 from migrating. The barrier layer includes Ta, TaN, Ti, TIN, CoW or a combination thereof, for example.

The thermal conductive patterns 130 may be arranged to surround the dies 110, so as to thermally couple to the dies 110 efficiently. In some embodiments, after disposing the dies 110, the carrier has a remaining area, and the thermal conductive patterns 130 occupies 2% to 98% of the remaining area of the carrier. In some embodiments, the thermal conductive patterns 130 have any suitable shapes. For example, from a top view, as shown in FIG. 2, the thermal conductive pattern 130 has a regular shape such as a circular shape, an oval shape, a rectangular shape and a rhombus shape or an irregular shape such as an amoeba shape. In some embodiments, first surfaces (e.g., top surfaces) of the thermal conductive pattern 130 are substantially coplanar with the surfaces (e.g., top surfaces) of the dies 110 and the encapsulant 120, and second surfaces (e.g., bottom surfaces) opposite to the first surfaces of the thermal conductive pattern 130 are in direct contact with the carrier 102.

Figure 1E:
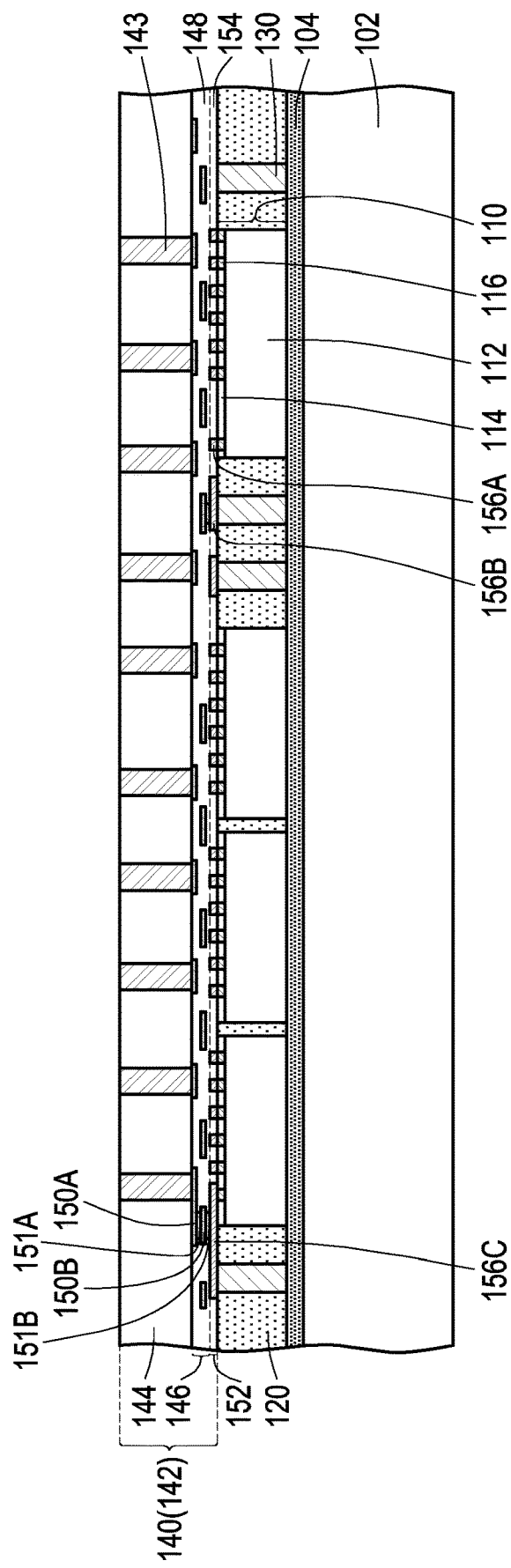

Referring to FIG. 1E, an interposer 140 is formed over the encapsulant 120, to bond to the dies 110. In some embodiments, the interposer 140 includes active devices, and thus the interposer 140 may be also referred to as an active interposer. For example, the interposer 140 is a wafer and includes a plurality of dies 142. It is noted that for clarity, only one die 142 is illustrated in FIG. 1E. Each die 142 may include a substrate 144, an active device in and/or on the substrate 144, an RDL structure 146 and a bonding structure 152. The substrate 144 is a semiconductor substrate, and the semiconductor substrate is made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations thereof, and the like, may also be used. In some embodiments, the substrate 144 includes a plurality of through vias 143 penetrating therethrough. In some embodiments, the through vias 143 are also referred to as thermal conductive patterns. The active device is I/O, double data rate synchronous dynamic random-access memory (DDR SDRAM), switched-capacitor CMOS voltage reference (SCVR), PHY, MOS, MOM and MIM, for example. In some embodiments, the heat generated by the die 142 of the interposer 140 is less than the heat generated by the dies 110. In some embodiments, during the fabrication of the semiconductor package, the interposer 140 may function as a supporting carrier.

In some embodiments, the RDL structure 146 is disposed between the substrate 144 and the bonding structure 152. The RDL structure 146 includes a dielectric layer 148 and a plurality of redistribution patterns 150A, 150B, 151A, 151B in the dielectric layer 148. In some embodiments, the redistribution patterns 150A, 150B, 151A, 151B are formed by forming the dielectric layer 148, forming a plurality of openings in the dielectric layer 148, forming a conductive material in the openings and removing the conductive material outside the openings. In some embodiments, the dielectric layer 148 includes silicon oxide, silicon oxynitride, silicon nitride, benzocyclobutene (BCB) polymer, polyimide (PI), polybenzoxazole (PBO) or a combination thereof, and is formed by a suitable process such as spin coating, CVD or the like. The dielectric layer 148 may be a single layer or a multiple-layer structure. The openings may be formed by a photolithography process including forming a photoresist over the dielectric material, and etching the dielectric material by an etch process such as a reactive ion etching (RIE) process and removing the photoresist. Formation of the conductive material may include forming a seed layer on the sidewalls of the openings and depositing a metal layer on the seed layer to fill up the openings. In some embodiments, the seed layer includes titanium (Ti)/copper (Cu), and the metal layer includes copper (Cu), aluminum (Al), aluminum copper alloy (AlCu), gold, titanium, cobalt, an alloy, or other suitable conductive material. The metal layer may be formed by, for example, electrochemical plating (ECP), electroplating, electroless plating or any other suitable process. The redistribution patterns 150A, 150B, 151A, 151B may include metal vias and/or metal lines. For example, the redistribution patterns 150A, 150B are metal lines, and the redistribution patterns 151A, 151B are metal vias. In some embodiments, the redistribution pattern 150A, 150B, 151A, 151B is formed by a dual damascene process, to form the metal via and the metal line simultaneously. In alternative embodiments, the redistribution pattern 150A, 150B, 151A, 151B is formed by multiple single damascene processes, to form the metal via and the metal line separately. In some embodiments, the redistribution pattern 150A, 150B, 151A, 151B has the metal layer and the seed layer therebeneath. However, the disclosure is not limited thereto. In alternative embodiments, the seed layer is omitted. In some embodiments, a barrier layer may be disposed between each redistribution pattern 150A, 150B, 151A, 151B and the dielectric layer 148 to prevent the material of the redistribution pattern 150A, 150B, 151A, 151B from migrating. The barrier layer includes Ta, TaN, Ti, TiN, CoW or a combination thereof, for example. In some embodiments, the RDL structure 146 has three layers of the redistribution patterns 150A, 150B, 151A, 151B. However, the disclosure is not limited thereto.

In some embodiments, the bonding structure 152 includes a bonding layer 154 and a plurality of bonding pads 156A, 156B, 156C in the bonding layer 154. In some embodiments, the interposer 142 and the dies 110 are bonded through a bumpless thermo-compression hybrid bonding. In some embodiments, the hybrid bonding is performed at a temperature in a range of 350° C. to 450° C. for a period of time in a range of 1.5 hours to 2.5 hours. In some embodiments, the bonding pads 156A of the interposer 140 are bonded to the bonding pads 116 of the dies 110, and the bonding layer 154 of the interposer 140 is bonded to the bonding layer 114 of the dies 110. In some embodiments, the bonding between the dies 110 and the interposer 142 is a die to wafer bonding. In some embodiments, the bonding pad 156A is bonded to the bonding pad 116 of the dies 110, and the bonding pad 156B is bonded to the thermal conductive pattern 130. For example, the bonding pad 156A is in direct contact with the bonding pad 116, and the bonding pad 156B is in direct contact with the thermal conductive pattern 130. In some embodiments, the bonding pad 156C is electrically connected to the bonding pads 116 and the thermal conductive pattern 130. For example, the bonding pad 156C is elongated to be in direct contact with both the bonding pads 116 and the thermal conductive pattern 130. In some embodiments, at least one of the thermal conductive patterns 130 may be not in direct contact with the bonding pads 156A, 156B, 156C. In such embodiments, the thermal conductive patterns 130 is in direct contact with the bonding layer 154. In some embodiments, the bonding layer 154 includes organic materials such as polybenzoxazole (PBO) and polyimide (PI) or inorganic materials. In some embodiments in which the dielectric layer 148 is composed of a plurality of layers, the bonding layer 154 and a layer of the dielectric layer 148 may be integrally formed, in other words, an interface doesn't exist between the bonding layer 154 and the layer of the dielectric layer 148. A material of the bonding pads 156A, 156B, 156C may include copper (Cu), aluminum (Al), aluminum copper alloy (AlCu), gold, titanium, cobalt, an alloy, or other suitable conductive material.

The redistribution pattern 150A may be electrically connected to the redistribution pattern 150B through the redistribution pattern 151A, and the redistribution pattern 150B may be electrically connected to the bonding pad 156A, 156B, 156C through the redistribution pattern 151B. The thermal conductive patterns 130 may be electrically connected to the RDL structure 146 or not.

Figure 1F:
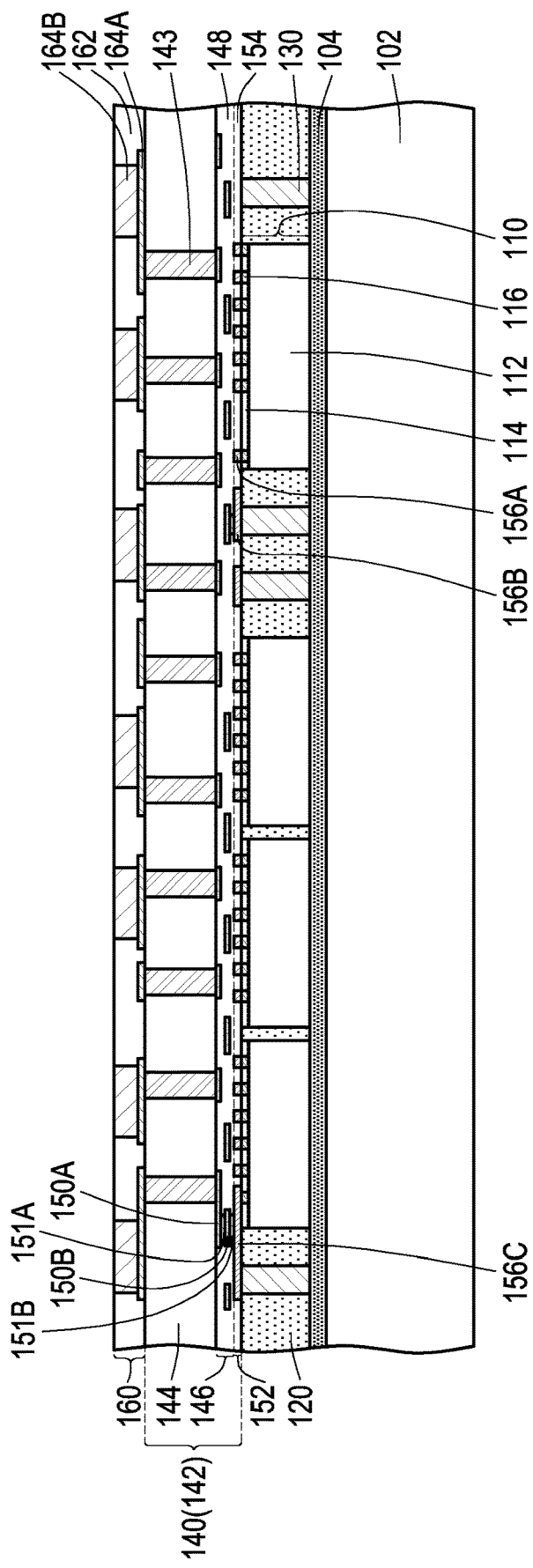

Referring to FIG. 1F, an RDL structure 160 is formed on the interposer 140, to electrically connect to the interposer 140. In some embodiments, the RDL structure 146 and the RDL structure 160 are disposed at opposite sides of the substrate 144. For example, the RDL structure 146 is disposed at the front side of the substrate 144, and the RDL structure 160 is disposed at the backside of the substrate 144. In some embodiments, the RDL structure 160 includes a dielectric layer 162 and a plurality of redistribution patterns 164A, 164B in the dielectric layer 162. The redistribution patterns 164A, 164B may be electrically connected to the through vias 143 of the interposer 140 (i.e., the die 142), and further electrically connected to the RDL structure 146 through the through vias 143. However, the disclosure is not limited thereto. In alternative embodiments, the redistribution pattern 164A, 164B may be not electrically connected to the RDL structure 146. In some embodiments, the redistribution patterns 164A, 164B are formed by forming the dielectric layer 162, forming a plurality of openings in the dielectric layer 162, forming a conductive material in the openings and removing the conductive material outside the openings. In some embodiments, the dielectric layer 162 includes silicon oxide, silicon oxynitride, silicon nitride, benzocyclobutene (BCB) polymer, polyimide (PI), polybenzoxazole (PBO) or a combination thereof, and is formed by a suitable process such as spin coating, CVD or the like. The dielectric layer 162 may be a single layer or a multiple-layer structure. The openings may be formed by a photolithography process including forming a photoresist over the dielectric material, and etching the dielectric material by an etch process such as a reactive ion etching (RIE) process and removing the photoresist. Formation of the conductive material may include forming a seed layer on the sidewalls of the openings and depositing a metal layer on the seed layer to fill up the openings. In some embodiments, the seed layer includes titanium (Ti)/copper (Cu), and the metal layer includes copper (Cu), aluminum (Al), aluminum copper alloy (AlCu), gold, titanium, cobalt, an alloy, or other suitable conductive material. The metal layer may be formed by, for example, electrochemical plating (ECP), electroplating, electroless plating or any other suitable process. The redistribution patterns 164A, 164B may include metal vias and/or metal lines. In some embodiments, the redistribution pattern 164A, 164B is formed by a dual damascene process, to form the metal via and the metal line simultaneously. In alternative embodiments, the redistribution pattern 164A, 164B is formed by multiple single damascene processes, to form the metal via and the metal line separately. In some embodiments, the redistribution pattern 164A, 164B has the metal layer and the seed layer therebeneath. However, the disclosure is not limited thereto. In alternative embodiments, the seed layer is omitted. In some embodiments, a barrier layer may be disposed between each redistribution pattern 164A, 164B and the dielectric layer 162 to prevent the material of the redistribution pattern 164A, 164B from migrating. The barrier layer includes Ta, TaN, Ti, TIN, CoW or a combination thereof, for example. In some embodiments, the RDL structure 160 has two layers of the redistribution patterns 164A, 164B. However, the disclosure is not limited thereto.

Figure 1G:
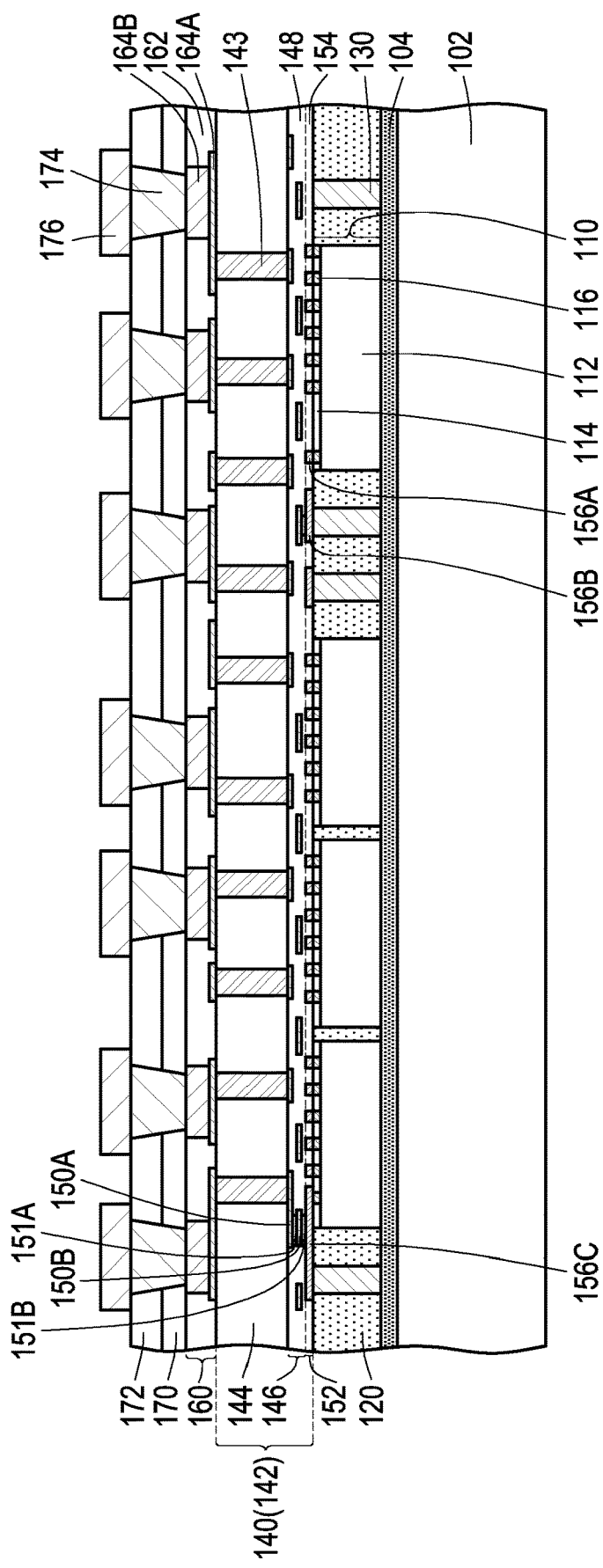

Referring to FIG. 1G, at least one dielectric layer 170, 172 is formed over the RDL structure 160, and a plurality of conductive patterns 174 are formed in the dielectric layer 170, 172 to electrically connect to the RDL structure 160. In some embodiments, the dielectric layer 170 is formed on the RDL structure 160, and the dielectric layer 172 is formed on the dielectric layer 170. In some embodiments, the dielectric layer 170, 172 includes silicon oxide, silicon oxynitride, silicon nitride, benzocyclobutene (BCB) polymer, polyimide (PI), polybenzoxazole (PBO) or a combination thereof, and is formed by a suitable process such as spin coating, CVD, PECVD or the like. For example, the dielectric layer 170 includes silicon nitride, and the dielectric layer 172 includes polyimide (PI). The dielectric layer 170 may be formed by PECVD process, and the dielectric layer 172 may be formed by coating and curing processes. In some embodiments, the dielectric layer 170 has a thickness in a range of 2000 angstroms to 10000 angstroms, and the dielectric layer 172 has a thickness in a range of 2.5 µm to 5 µm. The conductive patterns 174 may be formed by forming a plurality of openings in the dielectric layers 170, 172, forming a conductive material in the openings and removing the conductive material outside the openings. In some embodiments, the openings are formed by a photolithography process including forming a photoresist over the dielectric layers 170, 172, and etching the dielectric layers 170, 172 by an etch process such as a reactive ion etching (RIE) process and removing the photoresist. Formation of the conductive material may include forming a seed layer on the sidewalls of the openings and depositing a metal layer on the seed layer to fill up the openings. In some embodiments, the seed layer includes titanium (Ti)/copper (Cu), and the metal layer includes copper (Cu), aluminum (Al), aluminum copper alloy (AlCu), gold, titanium, cobalt, an alloy, or other suitable conductive material. The metal layer may be formed by, for example, electrochemical plating (ECP), electroplating, electroless plating or any other suitable process. The conductive patterns 174 are conductive pillars, for example.

Then, a plurality of conductive terminals 176 are formed on the dielectric layer 172, to electrically connect to the conductive patterns 174. The conductive terminals 176 may include solder material including alloys of tin, lead, silver, copper, nickel, bismuth, or combinations thereof. In some embodiments, the conductive terminals 176 may be arranged in an array. The conductive terminals 176 may include conductive pillars, micro-bumps, controlled collapse die connection (C4) bumps, ball grid array (BGA), electroless nickel-electroless palladium-immersion gold technique (ENEPIG) formed bumps, combination thereof (e.g., a metal pillar having a solder cap attached thereof), or the like. In alternative embodiments, the conductive terminal 176 may further bond to a circuit device such as a PCB or a heat dissipation device.

Figure 1H:
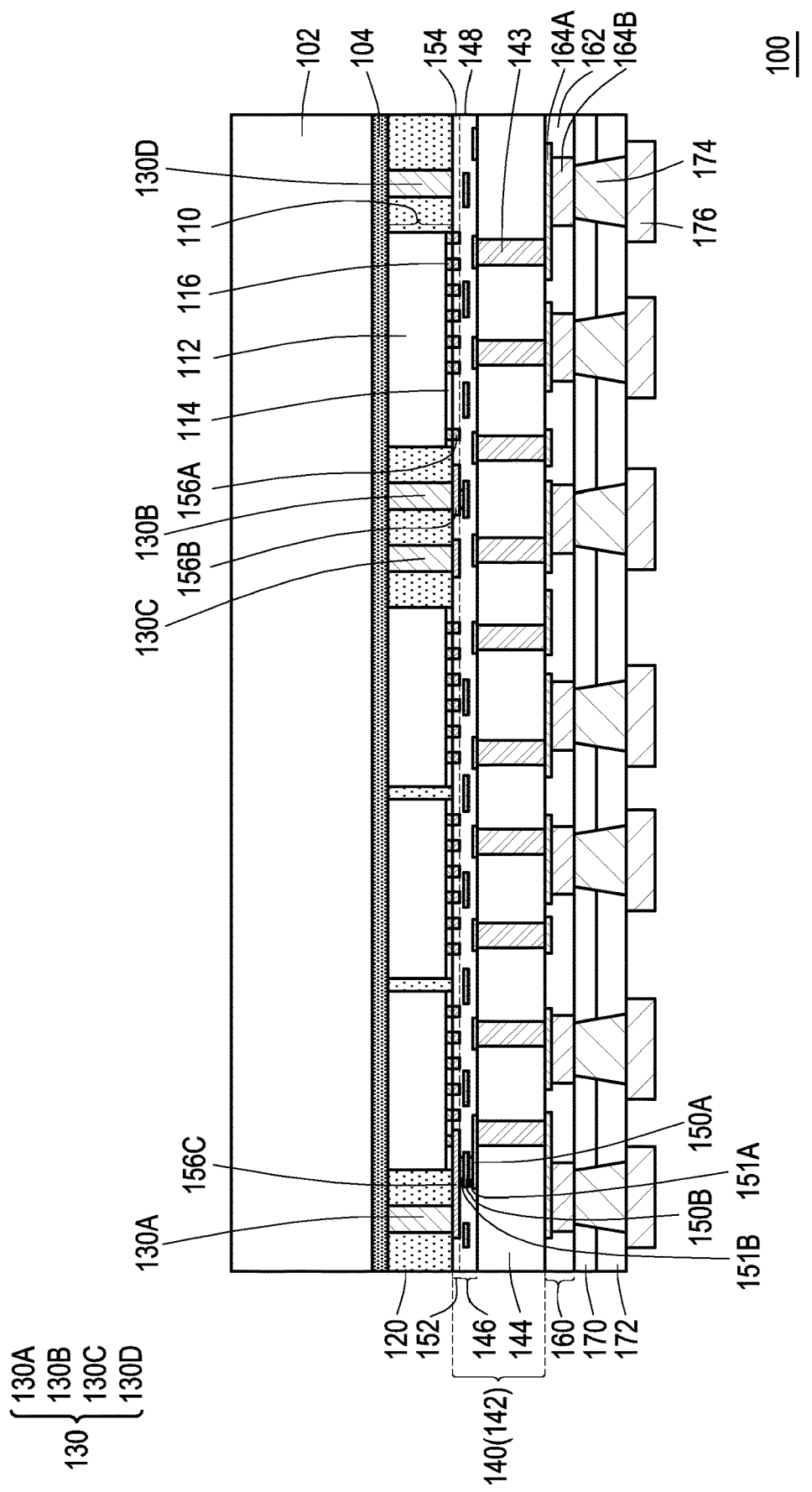

Referring to FIG. 1H, a dicing (cutting) process is performed, so as to form a semiconductor package 100. In some embodiments, the dicing process is performed on the dielectric layers 170, 172 and the dielectric layer 148, 162 of the RDL structures 146, 160. In some embodiments, the formed semiconductor package 100 may be a system-on-integrated-chips (SoIC) package, a chip on wafer on substrate (CoWoS) or an integrated fan out (InFo) wafer level package. For example, the semiconductor package 100 is a high performance computing (HPC) SoC, GPU, TPU or NPU. In some embodiments, the semiconductor package 100 has an inverted SoIC structure. In some embodiments, the semiconductor package 100 includes the carrier 102, the dies 110 on the carrier 102 and the interposer 140 including the die 142 bonded to the dies 110. In such embodiments, the interconnect length is shortened, and the interconnect latency and the speed are improved, which is suitable for AI accelerators and AI engine products. In addition, the carrier 102 functions as a supporting substrate during the manufacturing the semiconductor package 100, and functions as a heat sink after the semiconductor package 100 is formed. In some embodiments, the heat generated by any component of the semiconductor package 100 such as the dies 110 or the die 142 may be dissipated through the thermal conductive patterns 130 and the carrier 102. Accordingly, the thermal dissipation area for the semiconductor package 100 is expanded. In some embodiments, the thermal conductive patterns 130 are further coupled to the bonding pads 156B, 156C and the redistribution patterns 150A, 150B, 151A, 151B of the RDL structure 146. For example, a heat conduction path is formed between the bonding pad 156B, the thermal conductive pattern 130 and the carrier 102. In addition, a heat conduction path is formed among the redistribution pattern 164A, 164B, the through via 143 thermally coupled to the redistribution pattern 164A, 164B, the redistribution patterns 150A, 150B, 151A, 151B (including the metal lines and the metal via(s) therebetween) thermally coupled to the through via 143, the bonding pad 156C thermally coupled to the redistribution patterns 150A, 150B, 151A, 151B, the thermal conductive pattern 130 thermally coupled to the bonding pad 156C, and the carrier 102 thermally coupled to the thermal conductive pattern 130. Herein, "thermally coupled to" includes "in direct contact with" and "disposed adjacent to". In other words, these elements may be in direct contact with contact with each other or not. In some embodiments, any element in the heat conduction path or adjacent to the heat conduction path may be also referred to as a thermal conductive pattern. The thermal conductive pattern such as the thermal conductive pattern 130 and the through via 143 may have a diameter substantially equal to or larger than 50 µm.

Figure 3:
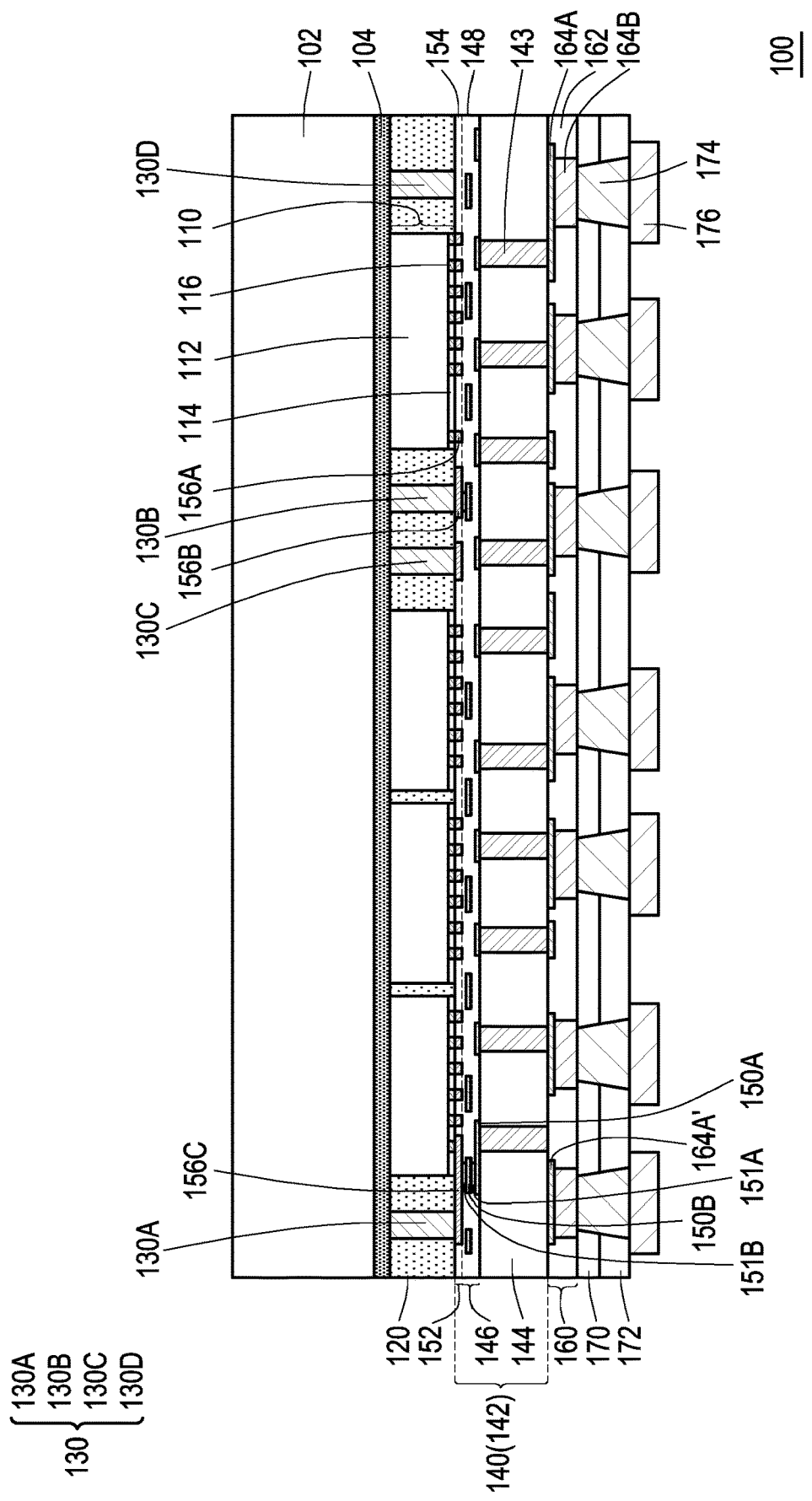
FIG. 3 illustrates a schematic cross-sectional view of a semiconductor package in accordance with some embodiments of the disclosure.

In some embodiments, the RDL structure 146 may have different connection structures. For example, a first connecting structure includes the redistribution patterns 150A, 151A, 150B, 151B and the bonding pad 156A, 156B or 156C which are physically connected to one another. A second connecting structure may include the redistribution pattern 150A, 151A and 150B which are physically connected to one another. A third connecting structure may include the redistribution patterns 150B and 151B and the bonding pad 156A, 156B or 156C which are physically connected to one another. The thermal conductive patterns 130 may be electrically connected to the RDL structure 146 or not. For example, the thermal conductive pattern 130A, 130B, 130C is electrically connected to the RDL structure 146, and the thermal conductive pattern 130D is not electrically connected to the RDL structure 146. In some embodiments, the thermal conductive pattern 130A is in physical contact with the first connecting structure, the thermal conductive pattern 130B is in physical contact with the second connecting structure, the thermal conductive pattern 130C is in physical contact with the redistribution pattern 150A which is electrically floating, and the thermal conductive pattern 130D is separated from the outermost redistribution pattern 150A. The heat conduction path may include any combination of the carrier 102, the thermal conductive pattern 130A, 130B, 130C, 130D, the first, second or third connecting structure of the RDL structure 146, the through via 143, the redistribution pattern 164A, 164B of the RDL structure 160, the conductive pattern 174, and the conductive terminal 176. In some embodiments, the outermost redistribution pattern 164A of the RDL structure 160 is electrically connected to the through via 143. However, the disclosure is not limited thereto. In some embodiments, as shown in FIG. 3, at least one outermost redistribution pattern 164A' of the RDL structure 160 is separated from the through via 143 and thus electrically isolated from the RDL structure 146. In such embodiments, the heat conduction path does not pass through the redistribution pattern 164A'.

In some embodiments, the heat conduction path is inserted between the dies 110 (such as AI computing cores). In some embodiments, the thermal dissipation efficiency of the local hot region where the dies 110 are disposed may be improved. In some embodiments, since the carrier 102 functions as a heat sink after the semiconductor package 100 is formed, an additional heat sink is not required. In addition, if required, the carrier 102 may have any configuration for heat dissipation or be connected to a heat dissipation device such as a water-cooling device.

Figure 4:
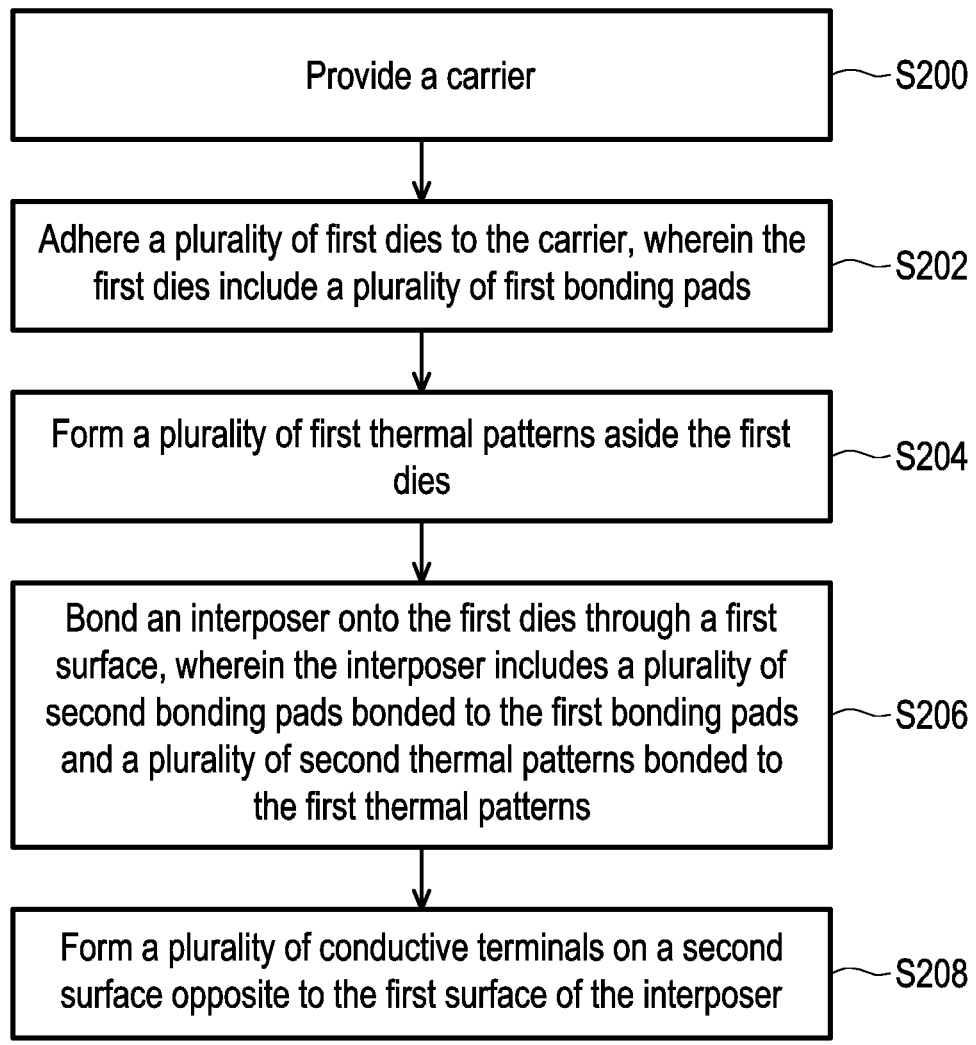
FIG. 4 illustrates a manufacturing method of a semiconductor package in accordance with some embodiments.

FIG. 4 illustrates a manufacturing method of a semiconductor package in accordance with some embodiments. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act S200, a carrier is provided. FIG. 1A illustrates a view corresponding to some embodiments of act S200.

At act S202, a plurality of first dies are adhered to the carrier, wherein the first dies include a plurality of first bonding pads. FIG. 1A and FIG. 3 illustrate views corresponding to some embodiments of act S202.

At act S204, a plurality of first thermal patterns are formed aside the first dies. FIG. 1C, FIG. 1D and FIG. 3 illustrate views corresponding to some embodiments of act S204.

At act S206, an interposer is bonded onto the first dies through a first surface, wherein the interposer includes a plurality of second bonding pads bonded to the first bonding pads and a plurality of second thermal patterns bonded to the first thermal patterns. FIG. 1E and FIG. 3 illustrate views corresponding to some embodiments of act S206.

At act S208, a plurality of conductive terminals are formed on a second surface opposite to the first surface of the interposer. FIG. 1G and FIG. 3 illustrate views corresponding to some embodiments of act S208.

In accordance with some embodiments of the disclosure, a semiconductor package includes a semiconductor substrate, a plurality of first dies, a plurality of thermal conductive patterns and an interposer. The first dies are bonded to the semiconductor substrate. The thermal conductive patterns are bonded to the semiconductor substrate. The interposer is bonded to the first dies, and the first dies and the thermal conductive patterns are disposed between the semiconductor substrate and the interposer.

In accordance with some embodiments of the disclosure, a semiconductor package includes a carrier, a plurality of first dies, a plurality of first through vias and a second die. The first dies are disposed in a first dielectric layer, and the first dies are adhered to the carrier through an adhesion layer, and the first dies comprise first bonding pads. The first through vias are disposed in the first dielectric layer. The second die includes a plurality of second bonding pads, a plurality of first redistribution patterns and a plurality of second through vias. The second bonding pads are directly bonded to the first bonding pads. The first redistribution patterns are electrically connected to and disposed between the second bonding pads and the second through vias.

In accordance with some embodiments of the disclosure, a manufacturing method of a semiconductor package includes following steps. A carrier is provided. A plurality of first dies are adhered to the carrier, and the first dies includes a plurality of first bonding pads. A plurality of first thermal patterns are formed aside the first dies. An interposer is bonded onto the first dies through a first surface. The interposer includes a plurality of second bonding pads bonded to the first bonding pads and a plurality of second thermal patterns bonded to the first thermal patterns. A plurality of conductive terminals are formed on a second surface opposite to the first surface of the interposer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor package, comprising:
a first semiconductor substrate;
a plurality of first dies, bonded to the first semiconductor substrate;
a plurality of thermal conductive patterns, bonded to the first semiconductor substrate; and
an interposer bonded to the first dies, the interposer comprising a second semiconductor substrate and a plurality of through vias penetrating through the second semiconductor substrate, wherein the first dies and the thermal conductive patterns are disposed between the first semiconductor substrate and the interposer.

2. The semiconductor package of claim 1, further comprising an encapsulant encapsulating the first dies and the thermal conductive patterns.

3. The semiconductor package of claim 2, wherein a surface of the encapsulant is substantially coplanar with surfaces of the first dies and the thermal conductive patterns.

4. The semiconductor package of claim 1, wherein the interposer further comprises:
a first RDL structure between the second semiconductor substrate and the first dies; and
a bonding structure, disposed between and electrically connected to the first dies and the first RDL structure, comprising a first bonding layer and a plurality of first bonding pads in the first bonding layer.

5. The semiconductor package of claim 4, further comprising a second RDL structure and a plurality of conductive terminals, wherein the second RDL structure are disposed between the second semiconductor substrate and the conductive terminals.

6. The semiconductor package of claim 5, wherein the through vias connect the first RDL structure and the second RDL structure.

7. The semiconductor package of claim 4, wherein the first dies comprise a plurality of second bonding pads in a second bonding layer, and the second bonding layer is bonded to the first bonding layer of the interposer and the second bonding pads are bonded to the first bonding pads of the interposer.

8. The semiconductor package of claim 1, wherein the first dies are adhered to the first semiconductor substrate through an adhesive layer.

9. A semiconductor package, comprising:
a carrier;
a plurality of first dies in a first dielectric layer, wherein the first dies are adhered to the carrier through an adhesion layer, and the first dies comprise first bonding pads;
a plurality of first through vias in the first dielectric layer; and
a second die, comprising:
a plurality of second bonding pads, directly bonded to the first bonding pads;
a plurality of first redistribution patterns; and
a plurality of second through vias in a semiconductor substrate, wherein the first redistribution patterns are electrically connected to and disposed between the second bonding pads and the second through vias.

10. The semiconductor package of claim 9, wherein the adhesion layer is continuously extended between the carrier and the first dies, and a sidewall of the carrier is substantially flush with a sidewall of the adhesion layer.

11. The semiconductor package of claim 9, wherein a sidewall of the carrier is substantially flush with sidewalls of the first dielectric layer and the second die.

12. The semiconductor package of claim 9, wherein the second die comprises a plurality of active devices.

13. The semiconductor package of claim 9, wherein the first dies further comprise a first bonding layer surrounding the first bonding pads, and the second die further comprises a second bonding layer directly bonded to the first bonding layer.

14. The semiconductor package of claim 9, further comprising a plurality of conductive terminals and a plurality of second redistribution patterns between the conductive terminals and the second through vias.

15. The semiconductor package of claim 9, wherein the first through vias are in direct contact with the carrier.

16. A manufacturing method of a semiconductor package, comprising:
providing a carrier;
adhering a plurality of first dies to the carrier, wherein the first dies comprise a plurality of first bonding pads;
forming a plurality of first thermal patterns aside the first dies;
bonding an interposer onto the first dies through a first surface, wherein the interposer comprises a semiconductor substrate, a plurality of through vias penetrating through the semiconductor substrate, a plurality of second bonding pads bonded to the first bonding pads and a plurality of second thermal patterns bonded to the first thermal patterns; and
forming a plurality of conductive terminals on a second surface opposite to the first surface of the interposer.

17. The method of claim 16, wherein the first dies are adhered to the carrier through an adhesion layer.

18. The method of claim 16, further comprising:
forming a first dielectric layer to fill gaps between the first dies;
forming a plurality of openings in the first dielectric layer; and
forming the first thermal patterns in the openings respectively.

19. The method of claim 16, wherein the second bonding pads are directly bonded to the first bonding pads, and the second thermal patterns are directly bonded to the first thermal patterns.

20. The method of claim 16, further comprising dicing the carrier and the interposer after forming the conductive terminals.

* * * * *